United States Patent
Birdsley et al.

(10) Patent No.: US 6,576,484 B1
(45) Date of Patent: Jun. 10, 2003

(54) IC DIE ANALYSIS VIA BACK SIDE CIRCUIT CONSTRUCTION WITH HEAT DISSIPATION

(75) Inventors: Jeffrey D. Birdsley, Austin, TX (US);
Michael R. Bruce, Austin, TX (US);
Brennan V. Davis, Austin, TX (US);
Rosalinda M. Ring, Austin, TX (US);
Daniel L. Stone, Cedar Park, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 14 days.

(21) Appl. No.: 09/864,668

(22) Filed: May 23, 2001

(51) Int. Cl.⁷ .................. H01L 21/00; H01L 21/66
(52) U.S. Cl. ................. 438/15; 438/12; 438/17
(58) Field of Search .................. 438/12, 14, 15, 438/17, 107, 117, 128, 127, 130, 131, 132, 5

(56) References Cited

U.S. PATENT DOCUMENTS

| | | | | |
|---|---|---|---|---|
| 3,656,232 A | * | 4/1972 | Hinchey | 29/833 |
| 4,782,381 A | * | 11/1988 | Ruby et al. | 257/724 |
| 4,979,015 A | * | 12/1990 | Stierman et al. | 257/778 |
| 5,070,040 A | * | 12/1991 | Pankove | 438/106 |
| 5,145,809 A | * | 9/1992 | Walker | 438/121 |
| 5,146,314 A | * | 9/1992 | Pankove | 257/712 |
| 5,312,765 A | * | 5/1994 | Kanber | 438/59 |
| 5,696,402 A | * | 12/1997 | Li | 257/510 |
| 6,124,179 A | * | 9/2000 | Adamic, Jr. | 438/309 |
| 6,180,989 B1 | * | 1/2001 | Bryant et al. | 257/414 |
| 6,204,087 B1 | * | 3/2001 | Parker et al. | 438/56 |
| 6,372,627 B1 | * | 4/2002 | Ring et al. | 438/622 |
| 6,448,095 B1 | * | 9/2002 | Birdsley et al. | 438/12 |
| 6,452,234 B1 | * | 9/2002 | Mahanpour | 257/349 |
| 6,501,142 B2 | * | 12/2002 | Thomas et al. | 257/414 |
| 2002/0185730 A1 | * | 12/2002 | Ahn et al. | 257/723 |

OTHER PUBLICATIONS

"CVD Silicon Carbide for Semiconductor Processing Components" Rohm and Haas Company, www.cvdmaterials.com/sicsemi.htm, 1999 month unknown.

Philip G. Neudeck, "Recent Progress in Silicon Carbide Semiconductor Electronics Technology" NASA Lewis Research Center, 1995, month unknown.

* cited by examiner

Primary Examiner—Michael S. Lebentritt

(57) ABSTRACT

Semiconductor analysis is enhanced using a system and method for improving the heat-dissipation characteristics of a semiconductor die. According to an example embodiment of the present invention, a flip-chip integrated circuit die having circuitry in a circuit side opposite a back side is formed having a back side including a thermal conductivity enhancing material. The thermal conductivity enhancing material improves the heat dissipating characteristics of the die during operation and testing and helps to reduce or prevent overheating. An epitaxial layer of silicon is formed in the back side, and circuitry is constructed in the epitaxial layer. Pre-existing circuitry on the circuit side and the newly formed circuitry in the back side are electrically coupled. The back side circuitry is operated in conjunction with the circuit side circuitry during testing and operation, and is useful, for example, for replacing defective circuitry, modifying circuit operation, and/or providing stimuli to the circuit side circuitry. The thermal conductivity enhancing material dissipates the heat generated by the circuitry and reduces the risk of a thermal related breakdown of the die. This improves the ability to analyze the die under normal and above normal operating temperatures without necessarily causing a failure in the die.

20 Claims, 5 Drawing Sheets

IC DIE ANALYSIS VIA BACK SIDE CIRCUIT CONSTRUCTION WITH HEAT DISSIPATION

FIELD OF THE INVENTION

The invention relates to semiconductor device assemblies and, more particularly, to techniques for analyzing and debugging circuitry associated with a flip chip integrated circuit die.

BACKGROUND OF THE INVENTION

Recent technological advances in the semiconductor industry have permitted dramatic increases in circuit density and complexity, and commensurate decreases in power consumption and package sizes for integrated circuit devices. Single-chip microprocessors now include many millions of transistors operating at speeds of hundreds of millions of instructions per second to be packaged in relatively small, air-cooled semiconductor device packages. A byproduct of these technological advances has been an increased demand for semiconductor-based products, as well as increased demand for these products to be fast, reliable, and inexpensive. These and other demands have led to increased pressure to manufacture a large number of semiconductor devices at an efficient pace while increasing the complexity and improving the reliability of the devices.

As the manufacturing processes for semiconductor devices and integrated circuits increase in difficulty, methods for manufacturing, testing and debugging these devices become increasingly important. Not only is it important to ensure that individual chips are functional, it is also important to ensure that batches of chips perform consistently. In addition, the ability to detect a defective manufacturing process early is helpful for reducing the possibility of manufacturing a defective device. It is also helpful to be able to perform the manufacture, testing and debugging of integrated circuits in an efficient and timely manner.

To increase the number of pad sites available for a die, to reduce the electrical path to the pad sites, and to address other problems, various chip-packaging techniques have been developed. One of these techniques is referred to as controlled collapse chip connection or "flip-chip" packaging. With packaging technology, bonding pads of the die include metal (solder) bumps. Electrical connection to the package is made when the die is "flipped" over and soldered to the package. Each bump connects to a corresponding package inner lead. The resulting packages are low profile and have low electrical resistance and a short electrical path. The output terminals of the package, which are sometimes ball-shaped conductive bump contacts, are typically disposed in a rectangular array. These packages are occasionally referred to as "Ball Grid Array" (BGA) packages. Alternatively, the output terminals of the package may be pins and such packages are commonly known as pin grid array (PGA) packages.

Once the die is attached to such a package, the back side portion of the die remains exposed. The transistors and other circuitry are generally formed in a very thin epitaxially grown silicon layer on a single crystal silicon wafer from which an individual die is later singulated. The side of the die including the epitaxial layer and containing the transistors and other circuitry is often referred to as the circuit side or front side of the die. The circuit side of the die is positioned very near the package and opposes the back side of the die. Between the back side and the circuit side of the die is bulk silicon. The positioning of the circuit side near the package provides many of the advantages of the flip-chip. However, orienting the die with the circuit side face down on a substrate is disadvantageous in some instances. Due to this orientation of the die, the transistors and circuitry near the circuit side are not directly accessible for testing, modification or other purposes. Therefore, access to the transistors and circuitry near the circuit side is limited.

Analysis of a flip-chip die may be performed through the back side using techniques such as scanning electron microscopy, scanning optical microscopy, or x-ray. These techniques often require the back side of the die to be thinned before they can be effectively employed. However, one function of the back side bulk silicon layer is to serve as a heat sink for the flip-chip die. When the tightly packed circuitry of the die is operated at high speeds it generates heat which if not dissipated causes the chip to overheat. Removal or other modifications to the back side bulk silicon layer that adversely effect the heat dissipating characteristics of the die exacerbate the overheating tendencies of the die.

Another method of testing and analysis of circuitry in an integrated circuit includes locating defective portions of the circuitry by controlling inputs to the die and monitoring outputs in order to determine if the die is operating as designed. This testing is facilitated by the use of testing circuitry located in a die, such as built-in self test (BIST) circuitry including redundant or replacement circuitry. However, concerns about maximizing use of space while minimizing manufacturing costs precludes putting extensive circuitry into a die for the sole purpose of testing. Additionally, constructing a limited number of "test dies" containing testing circuitry is not effective because the test die will have a different design then the standard die and will not necessarily function in the same manner.

SUMMARY OF THE INVENTION

The present invention is directed to flip-chip die analysis using a method that improves the thermal conductivity of the die, constructs circuitry in the back side of the thermal conductivity enhanced die and utilizes said circuitry to perform die analysis. The present invention is exemplified in a number of implementations and applications, aspects of which are summarized below.

In one example embodiment of the present invention, a portion of a back side of a flip-chip type integrated circuit die is formed having a thermal conductivity enhancing material. An epi-layer (epitaxial layer) of silicon is formed in the back side of the die. Circuitry is constructed in the epi-layer and electrically coupled to circuitry in the circuit side of the die. The circuit side circuitry and the newly formed back side circuitry are operated in conjunction with one another and used for analyzing the die. The heat from the operation of the circuit side circuitry and the additional heat generated by the operation of the back side circuitry is dissipated by the thermal conductivity enhancing material. In this manner, challenges to die analysis involving circuit construction and heat dissipation, such as those discussed in the Background, are met. Some of the example benefits realized by the present invention include the ability to selectively couple the test circuitry to portions of circuitry in the die, the ability to operate the die at high speeds and under stress as facilitated by the heat removal, and the ability to repair dies after or during analysis.

In another example embodiment of the present invention, a system is adapted for analyzing a semiconductor die. The system includes a formation arrangement adapted to form a backside having a thermal conductivity enhancing material such that heat generated during operation of the die is dissipated. A deposition arrangement is adapted to form a silicon epi-layer in the back side of the die. A construction arrangement is adapted to construct circuitry in the epi-layer, and a coupling arrangement is adapted to electrically couple the constructed circuitry with pre-existing circuitry in the circuit side of the die. The newly formed circuitry is adapted to operate in conjunction with the thermal conductivity enhancing material in a manner that facilitates analysis of the die via an analysis arrangement adapted to monitor the operation of the die and analyze the die therefrom.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
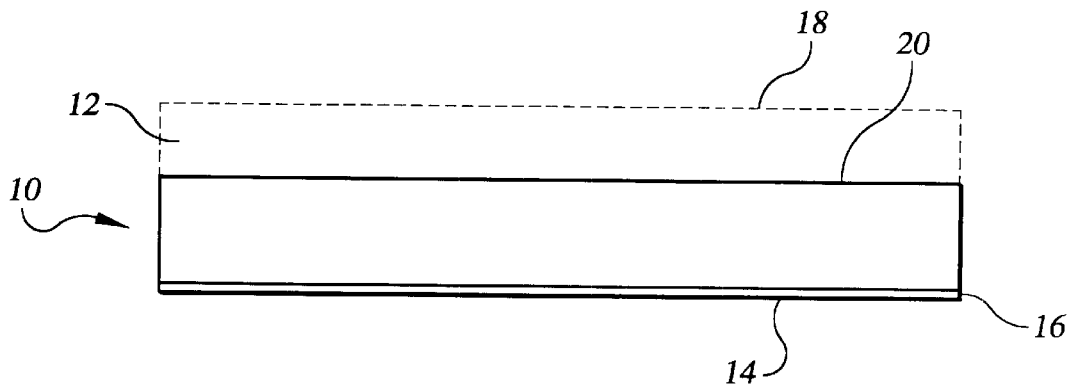
FIGS. 1A, 1B and 1C show a semiconductor die undergoing first, second and third stages, respectively, of an analysis procedure including doping, according to an example of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and has been found particularly suited to analysis of a flip-chip integrated circuit die. While not necessarily limited to such devices, various aspects of the invention may be appreciated through a discussion of various examples using this context.

According to an example embodiment of the present invention, a flip chip integrated circuit die having circuitry in a circuit side opposite a back side is manufactured and analyzed with circuitry constructed in the back side and a thermal conductivity enhancing material, such as a doped material or a material used to form the back side. The circuitry is constructed in an epi-layer formed in the back side and electrically coupled to circuitry in the circuit side of the die. The thermal conductivity enhancing material, such as diamond, silicon carbide, another suitable thermally-conducting dopant or a combination thereof, is introduced to the back side using one or more conventional doping or deposition methods. In one implementation, the epi-layer includes the thermal conductivity enhancing material. The constructed circuitry is activated and used for analyzing the die. The thermal conductivity enhancing material is used to draw heat away from the die, including heat generated by the operation of the constructed circuitry, facilitating the use of the constructed circuitry and the operation of the die under highspeed and other stress conditions.

The constructed circuitry is used in a variety of manners, depending upon selected applications. In one implementation, the constructed circuitry is used to replace or modify the operations of the circuit side circuitry. This is particularly useful, for example, to replace defective circuitry or to stimulate circuitry for analysis. In another implementation, the constructed circuitry is used to replace circuitry damaged during analysis. The constructed circuitry facilitates the analysis of portions of circuitry in the die that would, for example, otherwise be inhibited due to the destruction or modification of portions of the die necessary to perform the analysis. The various examples that follow exemplify selected implementations for the constructed circuitry.

There are a number of uses for the newly formed circuitry in the analysis of the die. In one example embodiment, the new circuitry is used to replace pre-existing circuitry in the die suspected of containing a defect to either positively or negatively confirm the existence of the suspected defect. In a die that contains a defect, a circuit path suspected of containing the defect is replaced with the newly formed circuitry in the back side of the die. The die is operated, and the existence or nonexistence of a defect is detected. Elimination of a recurring failure by the replacement of a specific circuit element indicates the replaced circuit element contains a defect. If the newly formed circuitry eliminates the failure, the replaced circuit is identified as being defective. If the failure still occurs, the replaced circuitry is identified as not being the cause of the failure. In this way, selective replacement of portions of circuitry in the die assists in locating defects.

In another example embodiment, circuitry that is known to have been damaged, for instance during earlier analysis, is replaced by circuitry built in the back side of the die. Circuitry is damaged during analysis, for example, when a buried circuit is accessed by removing circuitry overhead. The removed circuitry is replaced by circuitry in the back side of the die by coupling to the front side circuitry either before or after testing the accessed circuitry. The replacement of the damaged circuitry allows use and analysis of the undamaged portions of the integrated circuit die so that the die is not a loss. The back side circuitry is used to replace the damaged circuitry allowing the rest of the circuitry in the die to be tested instead of having to discard the chip or attempting to repair the damaged circuitry in the front side of the die.

In another example embodiment of the present invention, a programmable circuit is formed in the back side of the die and coupled to the front side circuitry. The programmable circuit provides programmability and hence, additional flexibility and uses for the back side circuitry. In one example, the back side programmable circuitry is used to stimulate the circuit side circuitry of the die including such things as biasing a gate or supplying a current or voltage.

The doping of the back side and the formation of the circuitry are performed in different orders in various implementations. In one implementation, the back side of the die is first doped, and an epi-layer is formed over the doped back side. Circuitry is constructed in the epi-layer and electrically coupled to the circuit side circuitry. In another implementation, the epi-layer is formed and the circuitry constructed therein prior to doping the back side. This may, for example, involve the selective removal of the epi-layer prior to doping for selectively doping portions of the back side. In still another implementation, the epi-layer is formed on the back side, the circuitry is constructed therein, and additional silicon is deposited over the epi-layer. The additional silicon is doped with the thermal conductivity enhancing dopant and used to conduct heat from the constructed circuitry and/or other portions of the die.

Various methods are used to dope the die, and are selected depending upon availability and upon the selected application. In one instance, a layer of thermal conductivity enhancing dopant is formed on the back side of the thinned bulk silicon back side layer by various methods such as chemical vapor deposition or sputtering. The deposited layer is diffused into the remaining bulk silicon by exposing the die to heat. Diffusion rates vary based upon the dopant and the temperature. In another instance, ion implantation is used to dope the back side bulk silicon layer of the die. The back side of the die is bombarded with a high energy beam of ions of a thermally conductivity enhancing dopant. An annealing step is performed to further drive the dopant into the bulk silicon, and additionally to repair damage done to the crystalline structure of the bulk silicon into which the ions are added.

The amount of doping is selected to meet the needs of a particular application, depending upon the desired amount of heat dissipation. The amount of doping can change as the style, design and architecture of integrated circuit dice vary significantly, and particular doping characteristics are selected based on known amounts of heat generation and amounts of heat dissipation lost due to, for example, removal of substrate from the die. In addition, the number of circuit elements formed in the epi-layer in the back side affect the heat generation. In implementations where relatively few circuit elements are formed, the amount of dopant used is less than implementations where a relatively large number of circuit elements are formed.

In one implementation, the thermal-conductivity enhancing material is transparent. The die is operated and heat generated during operation is dissipated using the transparent material. An image, such as an IR or visible image, is then obtained from the back side during operation. This is particularly useful for obtaining images while operating and removing from the die.

In another example embodiment of the present invention, silicon substrate in the back side of a flip-chip die is globally thinned prior to being doped with a thermally enhancing dopant. The removal of substrate also reduces the ability of the back side to dissipate heat. To accommodate the problem of overheating that can be associated with the removal of back side silicon substrate, additional dopant, as compared to the amount of dopant used had the back side not been thinned, is added to address overheating. The amount of dopant is dependant upon the characteristics of the circuitry contained within the die, and upon the desired amount of heat removal.

In another example embodiment of the present invention, the back side surface of a flip-chip die is cleaned and polished after doping. Dopant residue left on the surface of the silicon substrate is undesirable as it makes subsequent testing involving back side analysis more difficult to perform. Doping, particularly by ion implantation, also damages the surface of the silicon substrate, creating surface irregularities. The back side surface is mechanically or chemical-mechanically polished first to restore the surface to its pre-doping condition in order to facilitate any subsequent observing of the circuitry on the circuit side of the die through the back side. The subsequent testing is facilitated by polishing the back side surface and the elimination of surface irregularities, which minimizes the scattering of light incident on the interface between the air and the silicon of the back side of the die when, for example, a scanning optical microscope is used.

In another example embodiment of the present invention, a back side surface of a flip chip die is coated with a thermal conductivity enhancing dopant by plasma source ion implantation. The die is placed in a vacuum chamber, and a high ion density plasma is formed in the chamber. A pulsed laser is targeted at a source material to create a plasma plume consisting of atoms, molecules, plasma, and debris particles. A magnetic field is used to selectively guide the desired particles towards the substrate, and prevents undesired debris from condensing on the back side surface. Additionally, the die may be negatively biased to cause positive ions in the plasma to flow to the back side surface of the die. The hot plume contacts the back side surface and condenses as a solid as it cools.

Figure 1B:
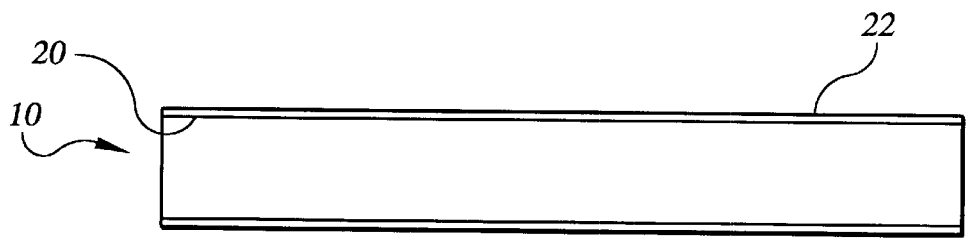
Figure 1C:
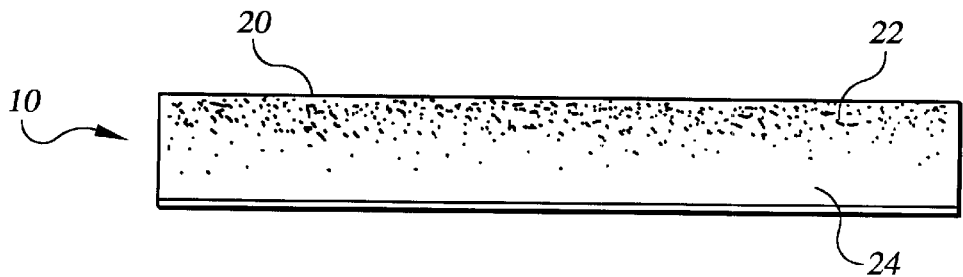

FIGS. 1A–1C show a flip-chip integrated circuit die undergoing analysis, according to an example embodiment of the present invention. FIG. 1a is a flip-chip die 10 in which a portion of silicon 12 in a back side 10 of the die is removed as a first step in the doping process. The thinning of the back side is optional and dependent on the characteristics of the die and the circuitry contained therein. The circuit side 14 of the die includes an epitaxial layer 16 having circuitry. The dotted line represents the back side surface 18 of the die, prior to thinning and the formation of an exposed surface 20. The back side 12 is thinned using one or more conventional methods such as mechanical polishing, chemical mechanical polishing, laser etching, and/or focused ion beam etching.

In FIG. 1B, a thermal conductivity enhancing dopant 22 is deposited over the back side 10 of the die. The thermal conductivity enhancing dopant is deposited onto the back side surface 20 of the die 10 using a conventional deposition method such as sputtering or chemical vapor deposition. The method chosen for deposition of the dopant 22 is dependent upon the dopant that is used, such as described hereinabove.

FIG. 1C shows the flip-chip die after the final step of a diffusion process in which the dopant 22 is driven into the bulk silicon layer 24 of the flip-chip die 10. The path of diffusion after the dopant 22 is deposited over the back side of the die spreads the dopant 22 through bulk silicon 24 to a depth controlled by the doping conditions and specific dopant used. The chemical gradient of the dopant 22 between the back side surface 20 of the flip-chip die and the underlying bulk silicon 24 is the driving force for the diffusion. The diffusion process is further stimulated by controlled application of heat to the system.

Figure 2:
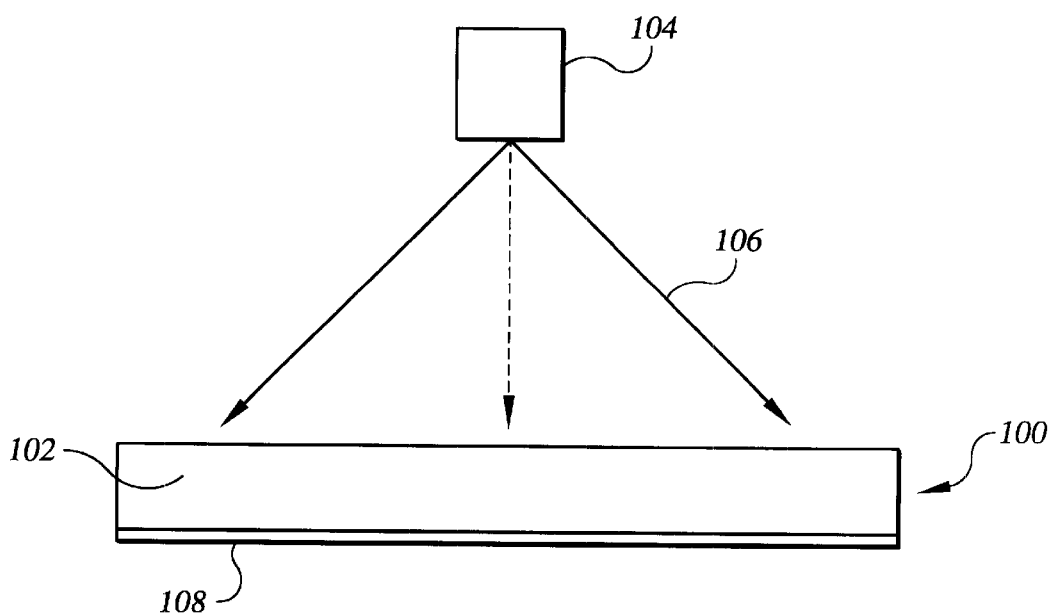
FIG. 2 is a semiconductor die undergoing doping, according to an example embodiment of the present invention.

FIG. 2 shows an example embodiment of the present invention in which a flip-chip type die 100 having a back side 102 opposite a circuit side 108 is doped by a process of ion implant. The surface of the back side layer 102 of the die 100 is bombarded with ions of a thermal conductivity enhancing dopant using an ion implanter 104 such as a FIB. The ion beam 106 from the implanter 104 implants the thermal conductivity enhancing dopant into the back side 102 of the silicon substrate layer 10. The ion implantation deposits the thermal conductivity enhancing dopant near the back side surface of the flip-chip die. A high temperature annealing step is used to drive the dopant to the desired depth within the silicon layer 102, and additionally, to repair damage to the surface of the back side of the die 100 caused by the impact of the ion beam 106.

In another example embodiment of the present invention the ion implanting system of FIG. 2 is used to selectively position a thermal conductivity enhancing dopant within the back side silicon layer 102 of a flip-chip die 100 to allow observation of circuit side circuitry of interest through the back side without necessarily encountering interference from the dopant. Techniques for viewing the circuitry in a flip-chip die from the back side include using tools such as near infrared microscopy or x-ray devices. Dopant particles, or the damage caused to the silicon substrate by the doping process, can interfere with the ability to view the circuitry of the die 100 located near the circuit side 108 of the die 100 from the back side. Implanting ions selectively along the periphery of the back side of the die 100 leaves a path through which the circuitry can be observed. Ion implantation is well suited to this application because it minimizes the unwanted migration of the dopant through the silicon substrate.

Figure 3:
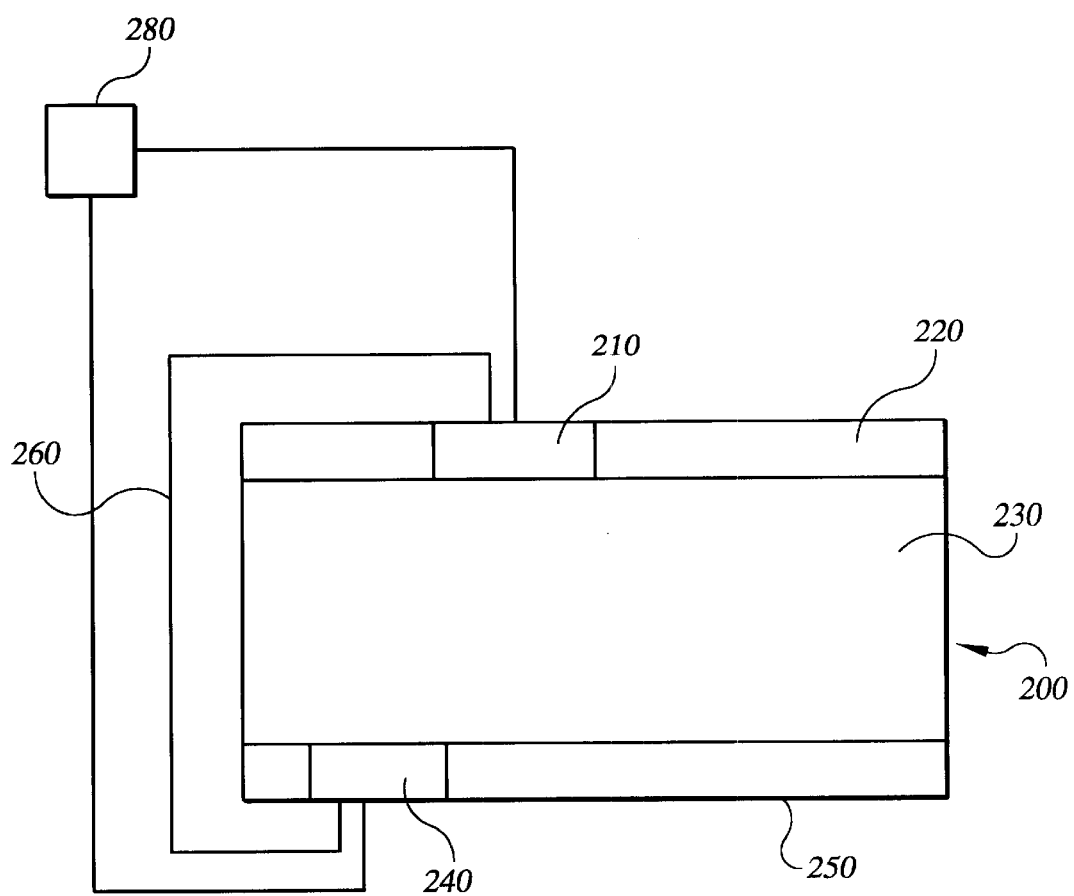
FIG. 3 is a semiconductor die with circuitry formed on the back side of the die, according to an example embodiment of the present invention.

In an example embodiment illustrated in FIG. 3, circuitry 210 is formed in an epi-layer of silicon 220 at a back side of a doped bulk silicon layer 230. The newly formed circuitry 210 is electrically coupled to the circuitry 240 on the circuit side 250 of the die 200 by a conductor 260. In a more particular implementation, an analysis device 280 is coupled to both the back side circuitry 210 and the circuit side circuitry 240, and is adapted to operate and/or detect a response from either circuit portions.

Figure 4A:
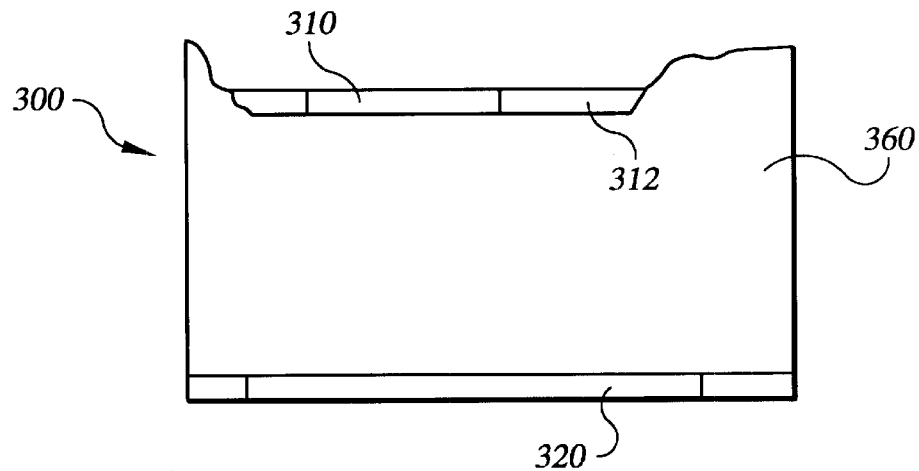
FIG. 4A is a semiconductor die with circuitry formed on the back side of the die, according to an example embodiment of the present invention.
Figure 4B:
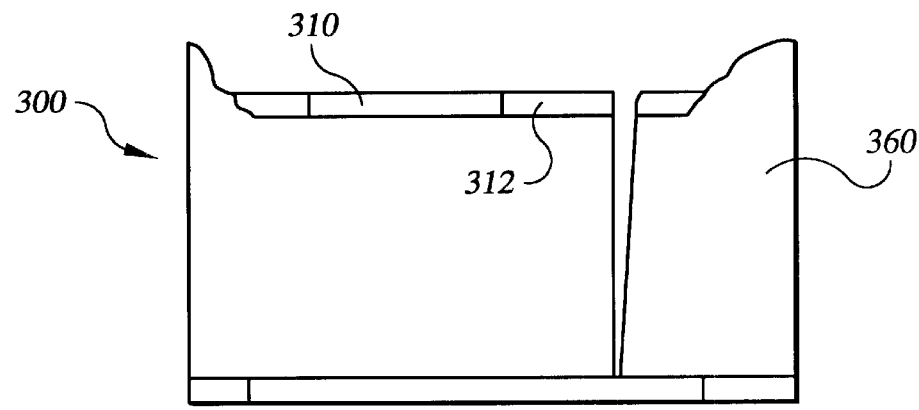
FIG. 4B is a semiconductor die with circuitry formed on the back side of the die, undergoing coupling to circuitry on the circuit side of the die, according to an example embodiment of the present invention.
Figure 4C:
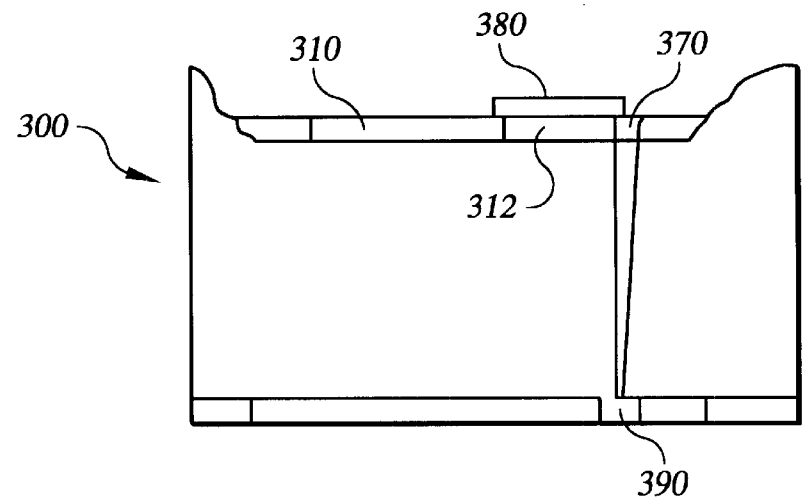
FIG. 4C is a semiconductor die with circuitry formed on the back side of the die undergoing coupling to circuitry on the circuit side of the die, according to an example embodiment of the present invention.

FIGS. 4A–4C show circuit construction in an integrated circuit die 300 having circuitry in a circuit side 320, according to another example embodiment of the present invention. In FIG. 4A, silicon in the back side 360 is doped with a thermal conductivity enhancing dopant. An epitaxial layer 312 is formed in the back side, and back side circuitry 310 is then formed in the epitaxial layer. The circuitry is formed using commonly-available devices and techniques, such as via the use of a FIB, laser, etching arrangement and/or a deposition arrangement. A hole is milled between the epitaxial layer 312 and the circuit side 320 in FIG. 4B. The milling is performed using an FIB etch, laser etch, a nano-machining tool or other suitable means.

The milled hole is filled with a conductive material 370 that forms an electrical contact between the epi-layer and the circuit side in FIG. 4C. A conductive wire lead 380, or other means of conducting electrical signals, may be required to extend the conductor to the desired portion of circuitry 310. The connection between the circuits may include contacting a specific portion 390 of a circuit, for example a source/drain region, a gate, an interconnect, or a bonding pad. In one implementation, the conductive material is deposited in the milled hole while simultaneously depositing an oxide. This is particularly useful for preventing leakage of current through the substrate.

Figure 5:
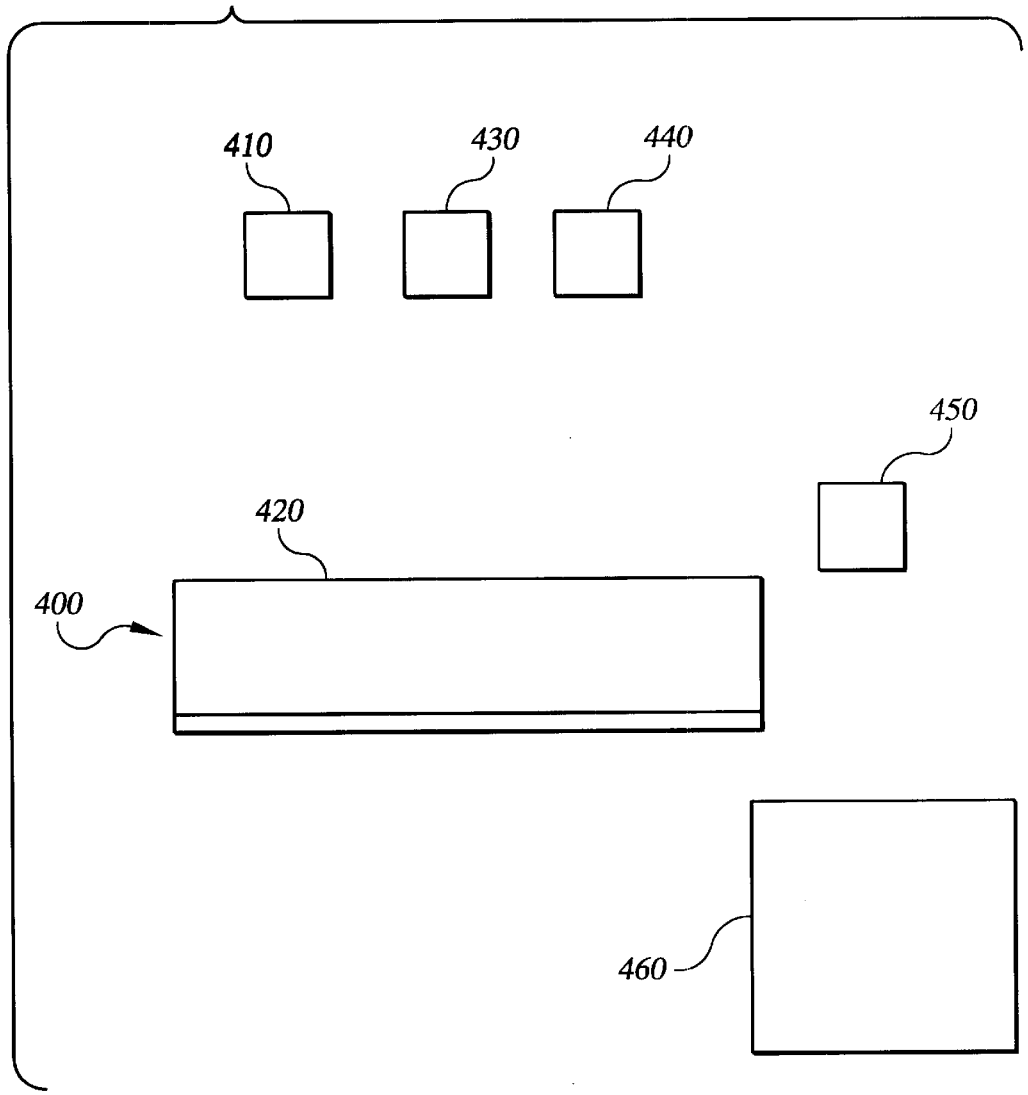
FIG. 5 is a system for semiconductor die analysis, according to an example embodiment of the present invention.

In another example embodiment of the present invention, FIG. 5 shows a system for analyzing a flip-chip die. The system includes a doping arrangement 410 adapted to dope the back side 420 of a flip chip integrated circuit die 400. A deposition arrangement 430 is adapted to form a thin layer of epitaxial silicon over the doped back side of the die. A construction arrangement 440 is adapted to construct circuitry in the back side epi-layer, such as transistors, programmable circuits, and other circuitry useful for replacing or modifying the circuitry located on the circuit side of the die and/or for stimulating the die. A coupling arrangement 450 is adapted to electrically couple the newly formed back side circuitry and the circuit side circuitry. An analysis arrangement 460, such as a computer or a test signal generator, is adapted to use the coupled back side and circuit side circuitry in conjunction with one another to analyze the die. The system uses the thermal conductivity enhancing dopant to dissipate heat during the analysis of the die.

The use of the back side circuitry permits flexibility in testing of the die. In one example embodiment, when a defect is determined.to exist, yet the location is unknown, the die is operated in a manner such that circuitry suspected of containing a defect is replaced by corresponding circuitry constructed in a back side. The new circuitry is used to replace pre-existing circuitry in the die suspected of containing a defect to either positively or negatively confirm the existence of the suspected defect. In another implementation, the circuitry constructed in the back side is adapted to stimulate existing circuitry in the die, and in another implementation the circuitry is adapted to be used as circuitry in addition to the existing circuitry.

While the present invention has been described with reference to several particular example embodiments, those skilled in the art will recognize that many changes may be made thereto without departing from the spirit and scope of the present invention, which is set forth in the following claims.

What is claimed is:

1. A method for manufacturing and analyzing a flip-chip integrated circuit die having circuitry in a circuit side opposite a back side, the method comprising:

providing a back side having a thermal conductivity enhancing material;

forming an epitaxial layer of silicon in the back side;

constructing circuitry in the epitaxial layer;

coupling the constructed circuitry in the back side to the circuit side circuitry; and operating the circuitry on the circuit side of the die in conjunction with the circuitry on the back side of the die, using the thermal conductivity enhancing material to dissipate heat and analyzing the die therefrom.

2. The method of claim 1, wherein providing a back side having a thermal conductivity enhancing material includes doping a portion of substrate in the back side of the die with a thermal conductivity enhancing dopant.

3. The method of claim 1, wherein providing a back side having a thermal conductivity enhancing material includes depositing a thermal conductivity enhancing material onto the back side of the flip-chip die.

4. The method of claim 3, wherein depositing a thermal conductivity enhancing material onto the back side of the flip-chip die includes at least one of: sputtering the material onto the back side of the die and chemical vapor depositing the material onto the back side of the die.

5. The method of claim 1, wherein providing a back side having a thermal conductivity enhancing material includes providing a back side having at least one of: diamond and silicon carbide.

6. The method of claim 1, wherein providing a backside having a thermal conductivity enhancing material and forming an epitaxial layer of silicon in the back side include growing a silicon carbide layer to form the back side that includes the epitaxial layer of silicon, and wherein constructing circuitry in the epitaxial layer includes constructing circuitry in the silicon carbide.

7. The method of claim 2, wherein doping a portion of the back side includes ion implanting a thermal conductivity enhancing material.

8. The method of claim 1, wherein constructing circuitry in the back side of the die includes forming at least one of: a replacement circuit, a programmable circuit, and a test circuit.

9. The method of claim 1, wherein coupling the circuitry includes at least one of:

forming a connection directly from the circuit side circuitry to the back side circuitry; and forming a connection from the circuit side circuitry to back side circuitry via a tester or other device.

10. The method of claim 1, wherein operating the die includes operating the die under a known failure condition.

11. The method of claim 1, wherein operating the die includes using the circuitry constructed in the epitaxial layer.

12. The method of claim 1, wherein analyzing the die includes replacing circuit side circuitry suspected of containing a defect with newly formed back side circuitry in order to positively or negatively confirm the existence of the defect in the suspect circuitry.

13. The method of claim 1, wherein operating the die includes using the circuitry constructed in the epitaxial layer to replace circuitry damaged during analysis of the die.

14. The method of claim 1, wherein analyzing the die includes monitoring the die for at least one of: overheating, stress failures, and operational failures.

15. The method of claim 2, further comprising thinning the back side of the die prior to doping, wherein doping a portion of the back side with a thermal conductivity enhancing dopant includes adding sufficient dopant to make the heat dissipating characteristics of the thinned back side approximately equal to the heat dissipating characteristics of the back side, prior to thinning.

16. An arrangement for analyzing a flip-chip integrated circuit die having circuitry in a circuit side opposite a back side, the arrangement comprising:

means for providing a back side having a thermal conductivity enhancing material that dissipates heat from the die during operation;

means for forming an epitaxial layer of silicon in the back side;

means for constructing circuitry in the epitaxial layer; and means for operating the circuitry on the circuit side of the die in conjunction with the circuitry on back side of the die while using the thermal conductivity enhancing material to dissipate heat and analyze the die therefrom.

17. A system for analyzing a flip-chip integrated circuit die having circuitry in a circuit side opposite a back side, the system comprising:

a forming arrangement adapted to provide a back side having a thermal conductivity enhancing material that dissipates heat from the die during operation;

a deposition arrangement adapted to form an epitaxial layer of silicon in the back side;

a construction arrangement adapted to construct circuitry in the epitaxial layer;

an electrical coupling arrangement adapted to electrically couple the circuitry in the circuit side with the circuitry constructed in the back side of the die; and an analysis arrangement adapted to operate the circuitry on the circuit side of the die in conjunction with the circuitry constructed in back side of the die while using the thermal conductivity enhancing material to dissipate heat, and analyze the die therefrom.

18. The system of claim 17, further comprising a substrate removal arrangement adapted to thin a portion of substrate in the back side of the die.

19. The system of claim 18, wherein the forming arrangement includes a doping arrangement adapted to sufficiently dope the back side to make the heat dissipating characteristics of the thinned back side approximately equal to the heat dissipating characteristics of the back side, prior to thinning.

20. The system of claim 17, wherein the forming arrangement and the deposition arrangement are included in a single deposition arrangement adapted to form a silicon carbide layer, the silicon carbide layer including the epitaxial layer.

* * * * *